United States Patent [19]

Makimoto et al.

[11] 4,382,238

[45] May 3, 1983

[54] BAND STOP FILTER AND CIRCUIT ARRANGEMENT FOR COMMON ANTENNA

[75] Inventors: Mitsuo Makimoto, Yokohama; Sadahiko Yamashita, Sagamihara, both of Japan

[73] Assignee: Matsushita Electric Industrial Company, Limited, Osaka, Japan

[21] Appl. No.: 211,897

[22] Filed: Dec. 1, 1980

[30] Foreign Application Priority Data

Nov. 30, 1979 [JP] Japan ................................ 54-155985

[51] Int. Cl.[3] ........................ H01P 1/213; H03H 7/46; H03H 7/01

[52] U.S. Cl. ...................................... 333/134; 333/206

[58] Field of Search ......................... 333/132, 202-209, 333/212, 219-226, 134-135, 124-126, 1, 100, 104; 343/850

[56] References Cited

U.S. PATENT DOCUMENTS 3,293,644 12/1966 Loos et al. .......................... 333/124
3,733,608 5/1973 McGhay et al. ............... 333/132 X
4,288,766 9/1981 Okita .................................. 333/204

OTHER PUBLICATIONS

Matthaei et al.—"Microwave Filters, Impedance-Matching Networks, and Coupling Structures", McGraw Hill, New York, 1964; pp. 216, 759-764, and title page.

*Primary Examiner*—Marvin L. Nussbaum
*Attorney, Agent, or Firm*—Lowe, King, Price & Becker

[57] ABSTRACT

In a band stop filter having a plurality of series resonating circuits, and coaxial cables connected between the series resonating circuits, the length of each of the coaxial cables is made either shorter or longer than quarter wavelength at the center frequency. With this arrangement, asymmetry is introduced in the insertion loss vs frequency characteristic curve so that the curve is sharper than the symmetrical curve in a given range, resulting in a reduction of insertion loss at a transmission band which resides either above or below the center frequency. Two band stop filters may be combined to constitute an antenna coupler for connecting a transmitter and a receiver to a common antenna. Each of the series resonating circuits used in the band stop filter may be constructed of a quarter wavelength coaxial resonator, which functions as a parallel resonating circuit, and a loop-like coaxial cable, which functions as a coupling capacitor.

18 Claims, 17 Drawing Figures

BAND STOP FILTER AND CIRCUIT ARRANGEMENT FOR COMMON ANTENNA

FIELD OF THE INVENTION

This invention generally relates to a band stop filter for high frequency signals, and to a circuit arrangement for a common antenna, which circuit arrangement comprises band stop filters.

BACKGROUND OF THE INVENTION

In conventional band stop filters for high frequencies, a plurality of series resonating circuits are connected via transmission lines, and when the center frequency is below 1,000 MHz, coaxial cables are used as the transmission lines so as to make the band stop filter small in size. Each of the coaxial cables used in such a band stop filter has a length which substantially equals one quarter wavelength at the center frequency. Although the conventional band stop filter having the above-mentioned structure has symmetrical frequency characteristic with respect to the center frequency, the sharpness of the frequency characteristic, namely the sharpness of the band rejecting characteristic, is not satisfactory. Furthermore, the insertion loss in the transmission band should be as low as possible. However the insertion loss of the conventional band stop filters is not satisfactorily low for some uses.

SUMMARY OF THE INVENTION

The present invention has been developed in order to remove the above-mentioned drawbacks and disadvantages inherent to the conventional band stop filters and to provide a circuit arrangement for a common antenna.

It is, therefore, a primary object of the present invention to provide a band stop filter, the insertion loss of which at the transmission band is remarkably reduced without deteriorating the band rejection characteristic at the center frequency.

Another object of the present invention is to provide such a band stop filter which is simple in construction and is small in size.

A further object of the present invention is to provide a circuit arrangement for connecting a receiver and a transmitter to a common antenna by utilizing two band stop filters.

A still further object of the present invention is to provide such a band stop filter in which the coupling coefficient or degree between each resonating circuit and each transmission line can be freely set.

A yet further object of the present invention is to provide such a band stop filter in which a high power signal can be treated.

BRIEF DESCRIPTION OF THE DRAWINGS

These and other objects and features of the present invention will become more readily apparent from the following detailed description of the preferred embodiments taken in conjunction with the accompanying drawings in which.

DETAILED DESCRIPTION OF THE PREFERRED EMBODIMENTS

Figure 1:
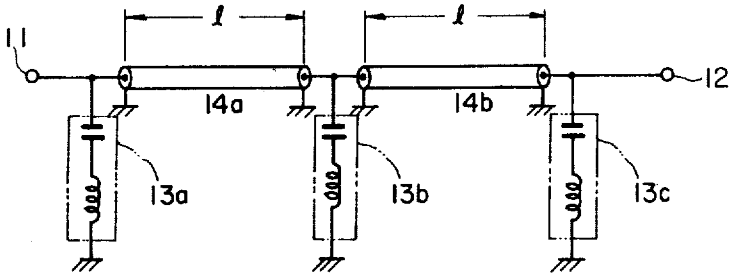
FIG. 1 is schematic circuit diagram of an embodiment of the band stop filter according to the present invention.

FIG. 1 illustrates a schematic circuit diagram of the band stop filter according to the present invention. Since the feature of the present invention resides in the fact that the length of transmission lines used in the band stop filter is made different from that in conventional band stop filters, the illustrated band stop filter also shows a conventional band stop filter. In order to clarify the features of the present invention, the conventional band stop filter is first discussed.

The band stop filter of FIG. 1 comprises an input terminal 11, an output terminal 12, three series reasoning circuits **13*a*, 13*b* and 13*c*, and two transmission lines 14*a* and 14*b*. Each of the transmission lines 14*a* and 14*b* is made of coaxial cable. The first resonating circuit 13*a* is connected between the input terminal 11 and ground, and the first coaxial cable 14*a* is connected between the input terminal 11 and one end of the second resonating circuit 13*b*, the other end of which is connected to ground. A junction connecting the first coaxial cable 14*a* and the second resonating circuit 13*b* is connected to one end of the second coaxial cable 14*b*, the other end of which is connected to the output terminal 12. The third resonating circuit is interposed between the output terminal 12 and ground. In the above-described connection, the inner conductors of coaxial cables 14*a* and 14*b*** are respectively connected to the resonating circuits 13a to 13c, while the outer conductors of the coaxial cables 14a and 14b are grounded as shown. Although the illustrated band stop filter comprises three resonating circuits and two transmission lines, the number of the resonating circuits and the transmission lines may be changed if desired.

Each of the resonating circuits 13a to 13c may be constructed of a lumped constant resonating circuit. However, distributed constant resonating circuits, which have a high unloaded Q, are usually used for these resonators 13a to 13c in order to obtain satisfactory circuit characteristics. Each of the coaxial cables 14a and 14b has a length expressed in terms of l, and the length in conventional band stop filters is selected to be equal to one quarter wavelength at the center frequency.

Figure 2:
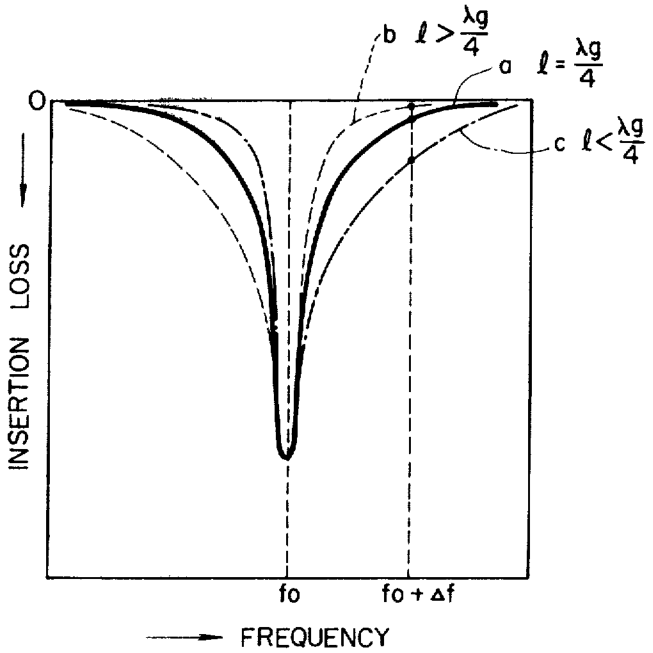
FIG. 2 is a graphical representation of the insertion loss vs frequency of the conventional band stop filter and of two different types of the band stop filter according to the present invention.

The insertion loss of such a conventional band stop filter is represented by a solid curve a in FIG. 2, and it will be noticed that the insertion loss curve a in the conventional band stop filter is symmetrical with respect to the center frequency which is expressed in terms of $f_0$. Assuming that the lowest frequency of the desired signal band to be transmitted through the band stop filter is expressed in terms of $f_0+\Delta f$, the insertion loss, i.e. the attenuation degree against the desired signal, should be as low as possible.

According to the present invention the length l of each coaxial cable 14a and 14b is made either shorter or longer than quarter wavelength $\lambda g/4$ ($\lambda g$ is the wavelength at the center frequency $f_0$ and $\lambda g/4$ corresponds to 90 degrees in electrical length) by 5 to 20 percent. When the length l of each of the coaxial cables 14a and 14b is made longer than $\lambda g/4$, the insertion loss varies with respect to frequencies as shown by the curve b in FIG. 2. Namely, the curve b is very sharp at frequencies immediately above the center frequency $f_0$, while the curve b is dull at frequencies immediately below the center frequency $f_0$. On the other hand, when the length l of each of the coaxial cables 14a and 14b is made shorter than $\lambda g/4$, the insertion loss varies with respect to frequencies as shown by the curve c in FIG. 2. Namely, the insertion loss characteristic represented by the curve c is opposite to the characteristic of the curve b. From the above it will be understood that the insertion loss with respect to the desired frequency $f_0+\Delta f$ can be reduced if the length l is made longer than $\lambda g/4$. In the same manner, if the desired frequency is below the center frequency $f_0$, namely, when the desired frequency is expressed in terms of $f_0-\Delta f$, the insertion loss of the band stop filter can be reduced by using coaxial cables 14a and 14b each having a length shorter than $\lambda g/4$.

However, the length of respective coaxial cables 14a and 14b cannot be increased or decreased without any restriction. Hereinbelow, the method of finding an optimum length is disclosed.

Figure 3:
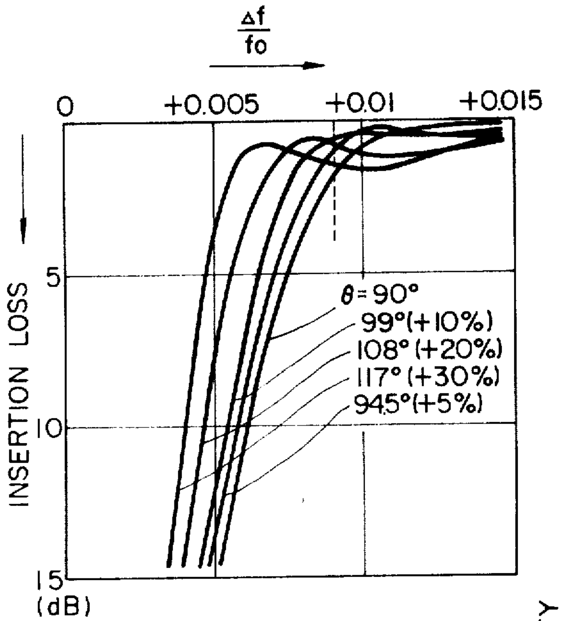
FIG. 3 is a graphical representation showing a transmitting characteristic, at transmission band, of a three-stage band stop filter, which graphical representation is useful for understanding the principle of the invention.

FIG. 3 is an example of the transmission band characteristics of a three-stage band stop filter. Namely, in the graph of FIG. 3, the ordinate is the insertion loss, and the abscissa is $\Delta f/f_0$ wherein $\Delta f$ is a frequency detuned from the center frequency $f_0$. The example is of a band stop filter having its transmission band above the center frequency $f_0$, and coaxial cables longer than 90 degrees in electrical length. In FIG. 3, five cases are shown, wherein the electrical length is set to 90 degrees, 94.5 degrees (+5 percent), 99 degrees (+10 percent), 108 degrees (+20 percent), and 117 degrees (+30 percent).

It is seen in FIG. 3, that as the length l increases, the insertion loss curve fluctuates at the transmission band. Since it is desired that the range of fluctuation should be less than 1 dB, the length l cannot be increased by as much as 20 percent. On the other hand, if the length l is increased by less than 5 percent, a satisfactory result is not obtained because the variation in the characteristic per se is small.

Figure 4:
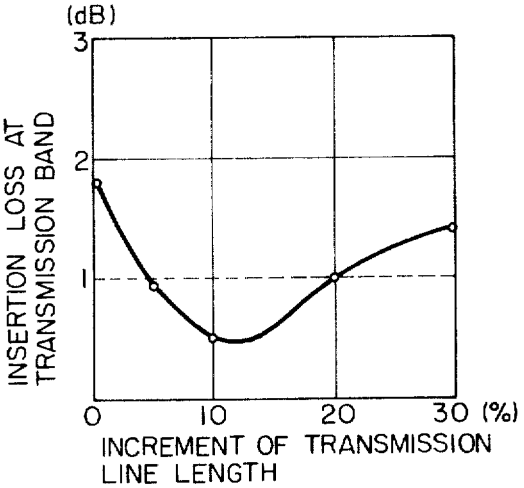
FIG. 4 is a graphical representation showing a characteristic of insertion loss vs increment of the transmission line length.

Illustratively a filter having a rejection band center frequency of 450 MHz and a transmission band of 454±0.1 MHz ($\Delta f=4.0$ MHz±100 KHz) is considered. The insertion loss at the transmission band is found from FIG. 3, and the insertion loss at the transmission band with respect to the increment of the length of the transmission line is shown by a graph in FIG. 4. It will be realized from FIG. 4 that the increment of the length of the transmission line should be within a range of 5 to 20 percent in order to maintain the insertion loss less than 1 dB. Furthermore, it will be seen that an optimum value of increment is between 10 and 15 percent where the insertion loss is the smallest.

Although the above-description is made in connection with an example in which the transmission line is longer than $\lambda g/4$, the above-mentioned values also apply to the situation wherein the transmission line is shorter than $\lambda g/4$. Namely, in when using shorter coaxial cables, the shortening should be between 5 and 20 percent for practical use in the same manner.

As described above, when cable length is made shorter or longer than $\lambda g/4$ by less than 5 percent, the symmetrical characteristic is not lost substantially. On the other hand, when the change in the length is over 20 percent, the insertion loss at the transmission band, as well as VSWR, is deteriorated. Accordingly, the change in the length should be between 5 and 20 percent. When the length is changed by 5 to 20 percent, the attenuation degree at the corner frequency $f_0$ differs only minimally from that in case of $l=\lambda g/4$.

Accordingly, reduction of the insertion loss at the transmission band can be attained by introducing an asymmetry in the insertion loss vs frequency curve, without deteriorating the band stop or rejection characteristic. Namely, when the transmission band resides above $f_0+\Delta f$, the curve b of FIG. 2 may be used, and on the other hand, when the transmission band resides below $f_0-\Delta f$, the curve c of FIG. 2 may be used.

Figure 5:
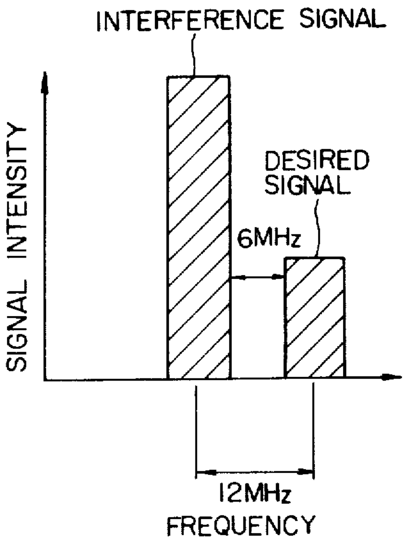
FIG. 5 shows a relationship between a desired TV broadcasting signal and an interference signal.

An illustrative example of the usage of the band stop filter according to the present invention is provided for a better understanding of the present invention. For instance, when receiving a TV broadcasting signal, especially in the UHF band, a problem is apt to occur if an interference signal is also received. In detail, as shown in FIG. 5, if an interference signal having an intensity much greater than that of a desired signal exists in a adjacent channel to the channel of the desired signal, the desired channel signal is cross modulated by the interference signal. Such cross modulation results in deterioration of the received desired signal quality. As a countermeasure against such a problem, in a TV receiving set for CATV system, a band stop filter is employed fully to attenuate the interference signal, while the desired signal is allowed to pass through as is. The reason that such a band stop filter is used instead of a band pass filter is that the insertion loss of a band pass filter at the transmission band is too great. Such a high insertion loss occurs because the frequency interval between the desired channel and the second adjacent channel is only 6 MHz. The band stop filter according to the present invention is satisfactorily used for the above-mentioned case or the like.

From the above, it will be understood that the band stop filter according to the present invention can be satisfactorily used when the transmission band resides either above or below the center frequency of the rejection band, and when the frequency interval between the transmission band and the rejection band is relatively narrow.

Figure 6:
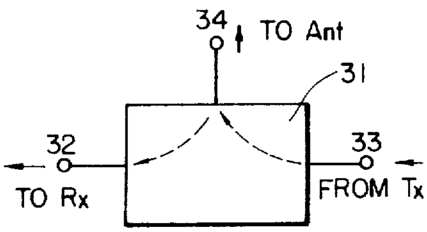
FIG. 6 shows a conceptional view of a circuit arrangement for connecting a receiver and a transmitter to a common antenna.

An applied example of the band stop filter according to the present invention will now be described. FIG. 6 illustrates a conceptional view of an antenna coupler or diplexer for a common antenna, which coupler is used for a mobile station. In detail, the reference 31 denotes the antenna coupler or circuit arrangement proper; 32, a terminal to be connected to a receiver Rx (not shown); 33, a terminal to be connected to a transmitter Tx (not shown); and 34, a terminal to be connected to a common antenna Ant (not shown). The function of the antenna coupler is to transmit an incoming frequency $f_R$ from the antenna Ant to the receiver Rx without transmitting the same to the transmitter Tx, and to transmit the output frequency $f_T$ of the transmitter Tx to the antenna Ant without transmitting the same to the receiver Rx. In the prior art, when constructing such a circuit arrangement for a common antenna, two band stop filters are utilized, especially if the signal frequency band is several hundreds MHz, the frequency interval between receiving and transmitting signals is less than 10 MHz, and signal band width is less than 5 MHz.

Figure 7:
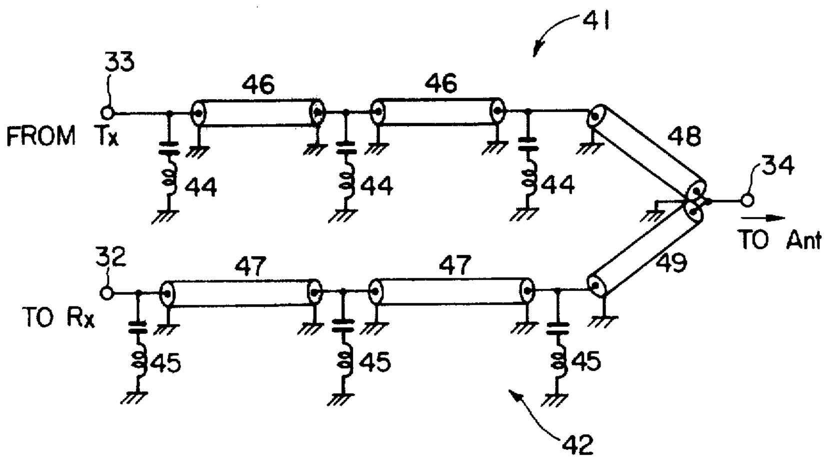
FIG. 7 is a schematic circuit diagram of a coupler for a common antenna, which coupler comprises two band stop filters according to the present invention.

Let it be supposed, for example, that the center frequency of the receiving signal is $f_{R0}$, the center frequency of the transmitting signal is $f_{T0}$, and $f_{R0} > f_{T0}$. FIG. 7 shows a circuit diagram of an antenna coupler having two band stop filters, where each of the band stop filters is of a three-stage configuration. The same reference numerals 32, 33 and 34 as in FIG. 6 are used to designate like terminals in FIG. 7. The circuit arrangement of FIG. 7 comprises first and second band stop filters 41 and 42 having the same structure as hereinabove described with reference to FIG. 1, and the first band stop filter 41 is connected to the terminal 33 for receiving the transmitting signal from the transmitter Tx, while the second band stop filter 42 is connected to another terminal 32 for supplying the receiver Rx with a received signal. The references 46 and 47 denote coaxial cables, and references 44 and 45 denote series resonating circuits. The references 48 and 49 denote cables respectively connected, at their one ends, to the other ends of the first and second band stop filters 41 and 42. The other ends of the calbes 48 and 49 are both connected to the terminal 34 which is to be connected to the antenna Ant.

The series resonating circuits 44 of the first band stop filter 41 are tuned to the center frequency $f_{R0}$, while the other series resonating circuits 45 of the second band stop filter 42 are tuned to the other center frequency $f_{T0}$. Each of the coaxial cables 46 has a length shorter than $\lambda g/4$ at $f_{R0}$ by 5 to 20 percent, while each of the coaxial cables 47 has a length longer than $\lambda g/4$ at $f_{T0}$ by 5 to 20 percent. The length of the coupling cable 48 is set to be equal to $\lambda g/4$ at $f_{R0}$. As a result, the impedance viewed from the antenna terminal 34 toward the transmitter terminal 33 is infinite at frequency $f_{R0}$. Accordingly, the received signal from the antenna Ant does not propagate toward the transmitter terminal 33. In the same manner, the length of the other coupling cable 49 is set to be equal to $\lambda g/4$ at $f_{T0}$. As a result, the impedance viewed from the antenna terminal 34 toward the receiver terminal 32 is infinite at frequency $f_{T0}$. Therefore, the output signal from the transmitter Tx is prevented from propagating toward the receiver terminal 32. Consequently, the received signal from the antenna Ant can be transmitted to the receiver Rx with minimum loss, while the output signal of the transmitter Tx can be also transmitted to the antenna Ant with minimum loss. Since the output frequency of the transmitter Tx is prevented from entering in the receiver Rx, both the transmitter Tx and receiver Rx can be operated simultaneously.

Figure 8:
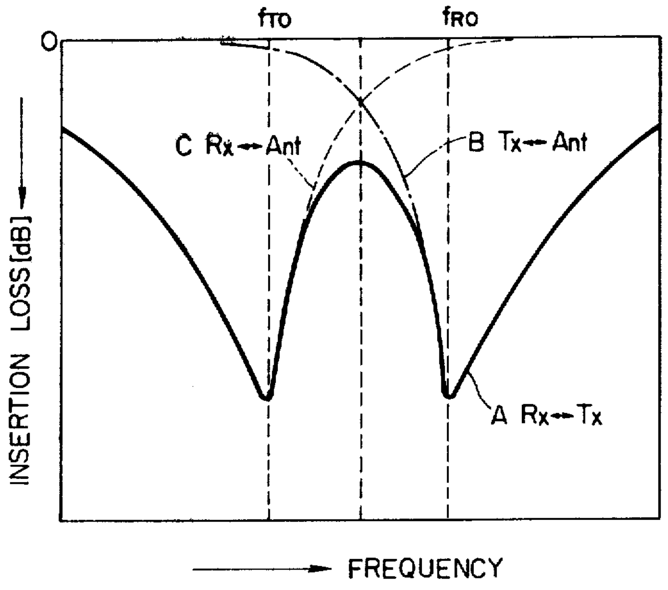
FIG. 8 is a graphical representation showing an insertion loss vs frequency characteristic obtained by the antenna coupler of FIG. 7.

FIG. 8 is a graphical representation showing the band rejection characteristic attained by the circuit arrangement of FIG. 7. In FIG. 8, a solid curve A shows the propagation characteristic between the receiver terminal 32 and the transmitter terminal 33, and it is seen that an adequate attenuation degree is obtained at both transmitting and receiving frequency bands. Another curve B (dot-dash line) represents the propagation characteristic between the transmitter terminal 33 and the antenna terminal 34, while the curve C (dotted line) represents the propagation characteristic between the receiver terminal 32 and the antenna terminal 34.

From the above, it will be understood that the insertion loss at a frequency band of a desired transmitting signal to be transmitted from the transmitter Tx to the antenna Ant and is very low, while the other insertion loss at a frequency band of a desired receiving signal to be transmitted from the antenna Ant to the receiver Rx is also very low because the above-mentioned asymmetry is respectively introduced to the insertion loss vs frequency curves of the first and second band stop filters 41 and 42 by respectively reducing the length of the coaxial cables 46 of the first band stop filter 41, and by increasing the length of the coaxial cables 47 of the second band stop filter 42 respectively from quarter wavelength, at their respective center frequencies, by 5 to 20 percent.

In the above-described embodiments, schematic circuit diagrams are used to describe the invention. Now the structure of the band stop filter according to the present invention is described in detail with reference to FIGS. 9 to 17. A resonator of distributed constant type is typically used as a resonating circuit for high frequencies, especially when the value of required unloaded Q is relatively high. Although a coaxial resonator having a length corresponding to half wavelength is satisfactory as a resonating circuit, usually a coaxial resonator of quarter wavelength is used for reducing the size thereof.

Figure 9:
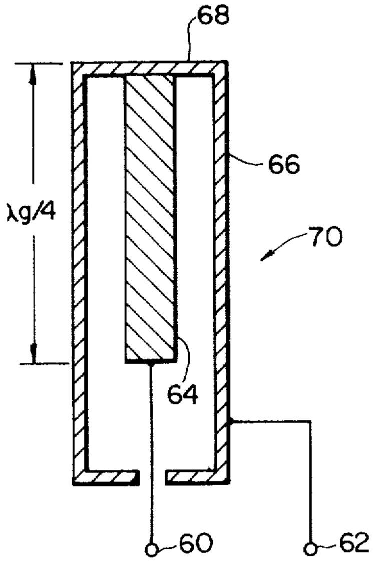
FIG. 9 is a cross-sectional view of a quarter wavelength coaxial resonator which functions as a parallel resonating circuit.

FIG. 9 shows a schematic cross-sectional view of such a quarter wavelength coaxial resonator, generally designated at a reference 70. As is well known, the coaxial resonator 70 comprises an inner conductor 64 surrounded by an outer conductor 66 in such a manner that the outer conductor 66 is spaced by a given distance from the inner conductor 64. The length of the inner conductor 64 is quarter wavelength $\lambda g/4$ at the center frequency of the resonating circuit, and one end of the inner conductor 64 and of the outer conductor 66 is respectively connected to terminals 60 and 62, while the other end of the inner conductor 64 is connected to the outer conductor 66 through a conductor 68. The quarter wavelength coaxial resonator 70 is expressed by way of an equivalent circuit shown in FIG. 10. Namely, the resonating circuit 70 is a parallel resonating circuit of a capacitor having a capacitance $C_P$, and a coil having an inductance $L_P$. Assuming that the characteristic impedance of the coaxial resonator 70 of FIG. 9 is expressed in terms of $Z_0=1/Y_0$, the values of $C_P$ and $L_P$ are respectively expressed by:

$$C_P=\pi Y_0/4\omega_0$$

$$L_P=1/\omega_0^2 C_P$$

Referring again to FIG. 1, it should be remembered that each of the resonating circuits 13*a* to 13*c* is a series resonating circuit. Therefore, the resonating circuit of FIG. 9 cannot be used individually. For making a series resonating circuit, as shown in FIG. 1, the quarter wavelength coaxial resonator is connected in series with a capacitor so that the parallel resonating circuit is converted into a series resonating circuit as will be described in detail hereinbelow.

Figure 10:
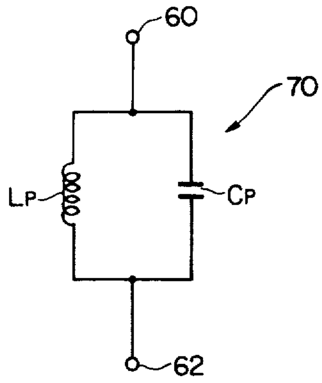
FIG. 10 is an equivalent circuit of the parallel resonating circuit of FIG. 9.
Figure 11:
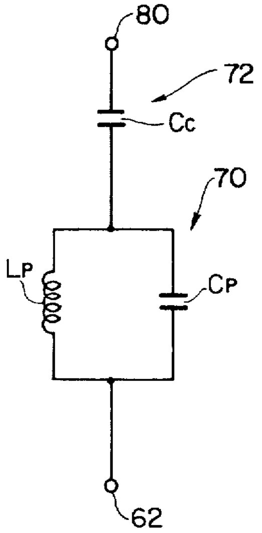
FIG. 11 is an equivalent circuit of a series circuit of a coupling capacitor and the parallel resonating circuit of FIG. 10.

FIG. 11 shows a series capacitor, having a capacitance $C_C$, which is connected to the parallel resonating circuit 70 of FIG. 10. The capacitance $C_C$ may be introduced by connecting a coupling capacitance. The equivalent circuit of FIG. 11 is further expressed by another equivalent circuit shown in FIG. 12. The equivalent circuit of FIG. 12 comprises a series circuit of a capacitor having a capacitance $C_S$, and a coil having an inductance $L_S$ in the same manner as the resonating circuits of FIG. 1. The capacitance $C_S$ and the inductance $L_S$ of the series circuit are respectively given by:

$$L_S=(C_P+C_C)/\omega_0^2 C_C^2$$

$$C_S=1/\omega_0^2 L_S$$

wherein $\omega_0^2=1/L_P(C_C+C_P)$

Figure 12:
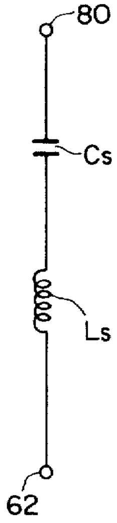
FIG. 12 is another equivalent circuit converted from the equivalent circuit of FIG. 11.

In practical use, a high voltage is applied across each element forming the series resonating circuits of a band stop filter. Therefore, it is preferable that the coupling capacitance $C_C$ of FIG. 12 is actualized by a capacitor which can withstand high voltage. Especially when making the above-mentioned antenna coupler for a common antenna, a high power is applied to the band stop filters included therein, and thus the type of the capacitors used as the coupling capacitances have to be selected.

Figure 13:
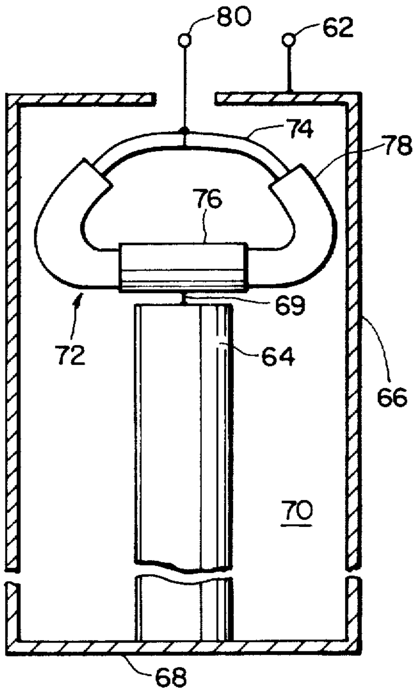
FIG. 13 is a cross-sectional view of a series resonating circuit used in the band stop filter of FIG. 1 and in the antenna coupler of FIG. 7.

Hence, reference is now made to FIG. 13 which shows a schematic cross-sectional view of a series resonating circuit having a quarter wavelength coaxial resonator 70 and a coupling capacitor 72. The coupling capacitor 72 is made of a coaxial cable having an inner conductor 74, a dielectric 78 partially covering the inner conductor 74, and an outer conductor 76 partially covering the dielectric 78. It will be understood that the combination of the coupling capacitor 72 and the quarter wavelength coaxial resonator 70 corresponds to each of the series resonating circuits 13*a* to 13*c* of FIG. 1. In the same manner, each of the series resonating circuits 44 and 45 of FIG. 7 may have the same structure as that of FIG. 13.

The coaxial cable forming the above-mentioned coupling capacitor 72 is arranged in a loop-like shape where both ends of the inner conductor 74 are connected to each other. The outer conductor 76 of the coaxial cable is electrically connected via a conductor 69 to the inner conductor 64 of the coaxial resonator forming the parallel resonating circuit 70.

Figure 14:
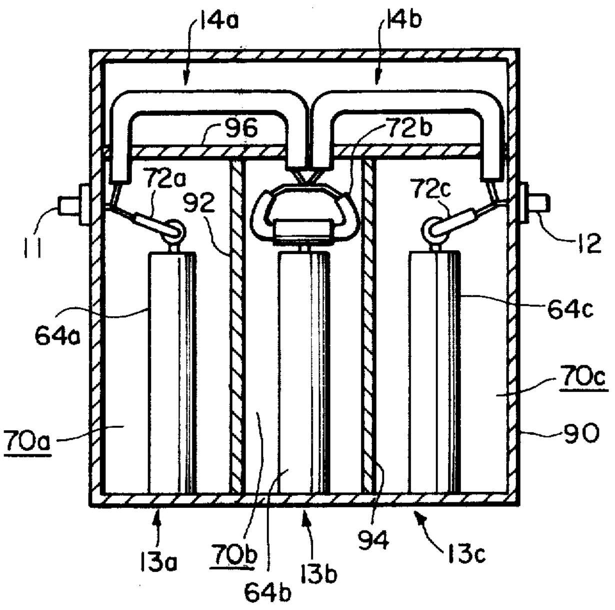
FIG. 14 is a cross-sectional view of the band stop filter, which corresponds to that of FIG. 1, according to the present invention.

FIG. 14 shows a detailed structure of the band stop filter according to the present invention. The band stop filter of FIG. 14 substantially corresponds to that of FIG. 1 and therefore, the same elements are designated at like numerals. In detail, the band stop filter comprises a housing 90 made of a metal, and three shielding plates 92, 94 and 96 for dividing the three stages in the band stop filter. Each section defined by the housing 90 and the shielding plates 92 to 96 corresponds to the series resonating circuit of FIG. 13. Namely, the outer conductor 68 of FIG. 13 is substituted with the shielding plates 92 to 96. The inner conductors of the three coaxial resonators 70*a* to 70*c* are respectively connected to the outer conductors of the coupling capacitors 72*a* to 72*c*. The inner conductors of the first and third coaxial cables 72*a* and 72*c* are respectively connected to the input and output terminals 11 and 12. The first transmission line 14*a*, whose length is either longer or shorter than $\lambda g/4$, is connected between the input terminal 11 and the inner conductor of the second coupling capacitor 72*b*, while the second transmission line 14*b*, whose length is also either longer or shorter than $\lambda g/4$, is connected between the inner conductor of the second capacitor 72*b* and the output terminal 12. The outer conductors of the first and second transmission lines 14*a* and 14*b*, which are made of coaxial cables as described hereinbefore, are electrically connected to the housing 90 through the third shielding plate 96. Although it is not shown, suitable adjusting screws may be provided for adjusting the resonating frequencies of respective series resonating circuits 13*a* to 13*c*. The band stop filter illustrated in FIG. 14 is of a three-stage configuration corresponding to FIG. 1, but the invention is not limited to such a three-stage type. Namely, the number of stages may be two or more than three if desired.

Figure 15:
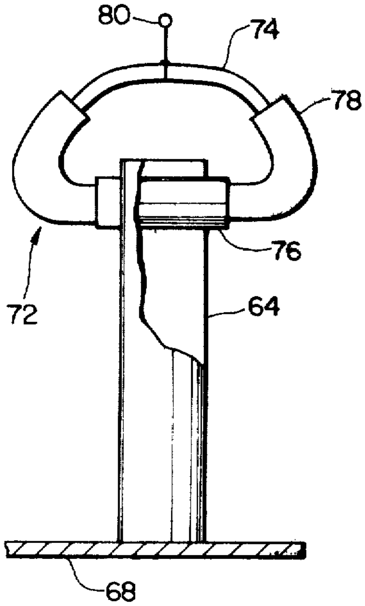
FIG. 15 is a front view of a modification of the series resonating circuit.

FIG. 15 shows a modification of the series resonating circuit. The series resonating circuit of FIG. 15 differs from that of FIG. 14 in that the coaxial cable, which functions as the above-mentioned coupling capacitor 72, is embedded in the inner conductor 64 of the coaxial resonator, which functions as the above-mentioned parallel resonating circuit 70. In detail, the coaxial cable of the coupling capacitor 72 is received in a through-hole made in the inner conductor 64 of the coaxial resonator 70 in such a manner that the outer conductor 76 of the coaxial cable 72 is electrically connected to the inner conductor 64.

Figure 16:
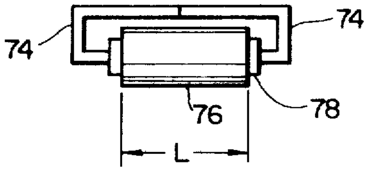
FIG. 16 is a schematic view of the coupling capacitor.

The structure of the above-mentioned coupling capacitors 72*a* to 72*c* will now be further described in detail. FIG. 16 is a schematic view of the above-mentioned coupling capacitor, where the same numerals as in FIG. 13 denote the like elements. Assuming that the longitudinal length of the outer conductor 76 of the coaxial cable, which forms the coupling capacitor, is expressed in terms of L, and the electrostatic capacitance between the inner conductor 74 and the outer conductor 76 per unit length is expressed in terms of $C_0$, then the equivalent capacitance C of the coupling capacitor of FIG. 16 is given by:

$$C=C_0\times L \quad (1)$$

The above-mentioned capacitance per unit length is given by:

$$C_0=2\pi\epsilon_0\epsilon_r/\log_e(R/r) \quad (2)$$

wherein r is the radius of the inner conductor 74;

R is the radius of the outer conductor 76;

$\epsilon_r$ is the specific inductive capacity of the dielectric 78 interposed between the inner and outer conductors 74 and 76; and $\epsilon_0$ is the dielectric constant of a vacuum.

The characteristic impedance $Z_0$ of the coaxial cable is given by:

$$Z_0 = \frac{\sqrt{\frac{\mu_0}{\epsilon_0}} \log_e\left(\frac{R}{r}\right)}{2\pi\sqrt{\epsilon_r}} \quad (3)$$

wherein $\mu_0$ is the magnetic permeability of a vacuum.

Accordingly, the electrostatic capacitance $C_0$ is expressed by means of the characteristic impedance $Z_0$ as follows:

$$C_0 = \frac{\sqrt{\epsilon_r}}{Z_0 V_c} \quad (4)$$

wherein $V_c$ is given by $$V_c = \frac{1}{\sqrt{\epsilon_0 \mu_0}},$$

and indicates the velocity of light.

A coaxial cable which corresponds to MIL standard RG-405/U is taken as an example. The coaxial cable comprises an inner conductor made of silver coated copper wire having a diameter of 0.51 millimeter, an outer conductor made of an annealed copper, having a diameter of 1.67 millimeter, and a dielectric filling made of Teflon (trademark) whose $\epsilon_r$ is 2.0. Since the characteristic impedance $Z_0$ is 50 ohms, and the specific inductive capacity $\epsilon_r$ is 2.0, the electrostatic capacitance $C_0$ per unit length is given by:

$$C_0 = 0.0944[\mathrm{pF/mm}]$$

Thus, if the longitudinal length L of the outer conductor, namely the distance along which the inner conductor is surrounded by the outer conductor, is 5 millimeters, the equivalent capacitance C is given by:

$$C = 0.472[\mathrm{pF}]$$

In order to treat a high electrical power the capacitor is required to withstand high voltage, and to provide a satisfactory capacitor the following steps are to be considered.

Figure 17:
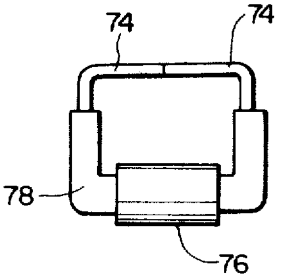
FIG. 17 is a schematic view of a modification of the coupling capacitor.

First of all, it is to be noted that, generally, the resistance due to skin effect is inversely proportional to the outer diameter of a conductor. Namely, as the outer diameter increases, the resistance decreases so that greater the diameter, higher the power to be treated. For this reason, a coaxial cable having a large diameter should be used. Nextly, the maximum allowable voltage for preventing discharging at both ends of the outer conductor 76 can be raised by making the length of the dielectric 78 covering the inner conductor 74 much longer than that of the outer conductor 76, as shown in FIG. 17. For instance, in case the longitudinal length of the dielectric 78 is 10 millimeters, the maximum allowable voltage is 10 KV, and in case of 15 millimeters, the same voltage 15 KV.

When it is intended to change the coupling coefficient of the coupling capacitor, the equivalent capacitance C thereof may be varied. The ways of changing the equivalent capacitance C are, as is apparent from the above-mentioned equations (1) to (4), as follows:

(A) to change the specific inductive capacitance $\epsilon_r$ of the dielectric 78;

(B) to change the ratio of the outer diameter of the inner conductor 74 to the outer diameter of the outer conductor 76, namely, to change the characteristic impedance while maintaining $\epsilon_r$ constant;

(C) to change the longitudinal length L of the outer conductor 76.

The shape of the coaxial cable arranged to serve as a coupling capacitor 72 is shown to be similar to an elliptical loop in FIG. 13 and FIG. 15, and to a rectangular loop in FIG. 16 and FIG. 17. However, the shape of the coupling capacitor made of a coaxial cable is not limited to these examples. Namely, other shapes, such as a triangular or pentagonal shape, may be used.

From the foregoing, it will be understood that the present invention provides a new and useful band stop filter and a circuit arrangement for a common antenna because the length of each transmission line made of a coaxial cable for connecting each series resonating circuit to another is made either longer or shorter than quarter wavelength. In addition, when designing a band stop filter, which is capable of withstanding high voltage, the coupling capacitor connected to the parallel resonating circuit for forming a series resonating circuit is made of a coaxial cable.

The above-described embodiments are just examples of the present invention, and therefore, it will be apparent for those skilled in the art that many modifications and variations may be made without departing from the spirit of the present invention.

What is claimed is:

1. A band stop filter comprising:

(a) input and output terminals;

(b) a plurality of series resonating circuits, one of which is connected between said input terminal and ground, and another series resonating circuit being connected between said output terminal and ground; and (c) a plurality of coaxial cables for connecting each one of said series resonating circuits to another, each of said coaxial cables having a length which is longer than quarter wavelength by an amount in the range of 5 to 20 percent thereof at the center frequency of the rejection band.

2. A band stop filter comprising:

(a) input and output terminals;

(b) a plurality of series resonating circuits, one of which is connected between said input terminal and ground, and another series resonating circuit being connected between said output terminal and ground; and (c) a plurality of coaxial cables for connecting each one of said series resonating circuits to another, each of said coaxial cables having a length which is shorter than quarter wavelength by an amount in the range of 5 to 20 percent thereof at the center frequency of the rejection band.

3. A band stop filter as claimed in claim 1 or 2, wherein each of said series resonating circuits comprises a coupling capacitor and a parallel resonating circuit connected in series with said coupling capacitor.

4. A band stop filter as claimed in claim 3, wherein said coupling capacitor is made of a loop-like coaxial cable.

5. A band stop filter as claimed in claim 3, wherein said parallel resonating circuit is made of a coaxial resonator having an inner conductor of quarter wavelength.

6. A band stop filter as claimed in claim 4, wherein said coaxial cable for forming said coupling capacitor comprises an inner conductor, both ends of which are connected to each other to form a loop; a dielectric partially covering said inner conductor; and an outer conductor partially covering said dielectric.

7. A band stop filter as claimed in claim 1 or 2, wherein each of said series resonating circuits comprises a coaxial cable functioning as a coupling capacitor, and a coaxial resonator functioning as a parallel resonating circuit, said coaxial cable having an inner conductor, both ends of which are connected to each other to form a loop; a dielectric partially covering said inner conductor; and an outer conductor partially covering said dielectric; said coaxial resonator having an inner conductor of quarter wavelength, and an outer conductor surrounding said second mentioned inner conductor in such a manner that said second mentioned outer conductor is spaced by a given distance from said second mentioned inner conductor; said second mentioned inner conductor being electrically connected to said first mentioned outer conductor of said coaxial cable.

8. A band stop filter as claimed in claim 7, wherein said coaxial cable is received in a through-hole made in said second mentioned inner conductor so that said first mentioned outer conductor of said coaxial cable is in contact with said second mentioned inner conductor of said coaxial resonator.

9. A circuit arrangement for a common antenna, comprising:

(a) a first band stop filter having input and output terminals, a plurality of series resonating circuits, one of which is connected between said input terminal and ground, and another series resonating circuit being connected between said output terminal and ground, and plurality of coaxial cables for connecting each one of said series resonating circuits to another, each of said coaxial cables having a length which is shorter than quarter wavelength at the center frequency of said first band stop filter;

(b) a second band stop filter having input and output terminals, a plurality of series resonating circuits, one of which is connected between said input terminal and ground, and another series resonating circuit being connected between said output terminal and ground, and a plurality of coaxial cables for connecting each one of said series resonating circuits to another, each of said coaxial cables having a length which is longer than quarter wavelength at the center frequency of said first band stop filter;

(c) a first coupling line connected between said output terminal of said first band stop filter and a terminal which is to be connected to said common antenna; and (d) a second coupling line connected between said input terminal of said second band stop filter and said terminal to be connected to said common antenna.

10. A circuit arrangement for a common antenna as claimed in claim 9, wherein each of said coaxial cables of said first band stop filter is shorter than said quarter wavelength at the center frequency of said first band stop filter by 5 to 20 percent; and wherein each of said coaxial cables of said second band stop filter is longer than said quarter wavelength at the center frequency of said second band stop filter by 5 to 20 percent.

11. A circuit arrangement for a common antenna as claimed in claim 9, wherein said first coupling line comprises a coaxial cable having a quarter wavelength at the center frequency of said second band stop filter; and wherein said second coupling line comprises a coaxial cable having a quarter wavelength at the center frequency of said first band stop filter.

12. A circuit arrangement for a common antenna as claimed in claim 9, wherein each of said series resonating circuits comprises a coupling capacitor made of a loop-like coaxial cable, and a parallel resonating circuit made of a quarter wavelength coaxial resonator, said parallel resonating circuit being connected in series with said coupling capacitor.

13. A band stop filter comprising:

(a) input and output terminals;

(b) a plurality of series resonating circuits, one of which is connected between said input terminal and ground, and another series resonating circuit being connected between said output terminal and ground, each of said series resonating circuits having a coupling capacitor and a parallel resonating circuit connected in series with said coupling capacitor, said coupling capacitor being made of a loop-like coaxial cable; and (c) a plurality of coaxial cables for connecting each one of said series resonating circuits to another, each of said coaxial cables having a length which is longer than quarter wavelength at the center frequency of the rejection band.

14. A band stop filter comprising:

(a) input and output terminals;

(b) a plurality of series resonating circuits, one of which is connected between said input terminal and ground, and another series resonating circuit being connected between said output terminal and ground, each of said series resonating circuits having a coupling capacitor and a parallel resonating circuit connected in series with said coupling capacitor, said coupling capacitor being made of a loop-like coaxial cable; and (c) a plurality of coaxial cables for connecting each one of said series resonating circuits to another, each of said coaxial cables having a length which is shorter than quarter wavelength at the center frequency of the rejection band.

15. A band stop filter as claimed in claim 13 or 14, wherein said coaxial cable for forming said coupling capacitor comprises an inner conductor, both ends of which are connected to each other to form a loop; a dielectric partially covering said inner conductor; and an outer conductor partially covering said dielectric.

16. A band stop filter comprising:

(a) input and output terminals;

(b) a plurality of series resonating circuits, one of which is connected between said input terminal and ground, and another series resonating circuit being connected between said output terminal and ground, each of said series resonating circuits having a coaxial cable functioning as a coupling capacitor, and a coaxial resonator functioning as a parallel resonating circuit, said coaxial cable having an inner conductor, both ends of which are connected to each other to form a loop; a dielectric partially covering said inner conductor; and an outer conductor partially covering said dielectric; said coaxial resonator having an inner conductor of quarter wavelength, and an outer conductor surrounding said second mentioned inner conductor in such a manner that said second mentioned outer conductor is spaced by a given distance from said second mentioned inner conductor; said second mentioned inner conductor being electrically connected to said first mentioned outer conductor of said coaxial cable; and (c) a plurality of coaxial cables for connecting each one of said series resonating circuits to another, each of said coaxial cables having a length which is longer than quarter wavelength at the center frequency of the rejection band.

17. A band stop filter comprising:

(a) input and output terminals;

(b) a plurality of series resonating circuits, one of which is connected between said input terminal and ground, and another series resonating circuit being connected between said output terminal and ground, each of said series resonating circuits having a coaxial cable functioning as a coupling capacitor, and a coaxial resonator functioning as a parallel resonating circuit, said coaxial cable having an inner conductor, both ends of which are connected to each other to form a loop; a dielectric partially covering said inner conductor; and an outer conductor partially covering said dielectric; said coaxial resonator having an inner conductor of quarter wavelength, and an outer conductor surrounding said second mentioned inner conductor in such a manner that said second mentioned outer conductor is spaced by a given distance from said second mentioned inner conductor; said second mentioned inner conductor being electrically connected to said first mentioned outer conductor of said coaxial cable; and (c) a plurality of coaxial cables for connecting each one of said series resonating circuits to another, each of said coaxial cables having a length which is shorter than quarter wavelength at the center frequency of the rejection band.

18. A band stop filter as claimed in claim 16 or 17, wherein said coaxial cable is received in a through-hole made in said second mentioned inner conductor so that said first mentioned outer conductor of said coaxial cable is in contact with said second mentioned inner conductor of said coaxial resonator.

* * * * *